United States Patent
Niizeki et al.

(10) Patent No.: US 11,637,003 B2
(45) Date of Patent: Apr. 25, 2023

(54) METHOD FOR ETCHING FILM AND PLASMA PROCESSING APPARATUS

(71) Applicant: TOKYO ELECTRON LIMITED, Tokyo (JP)

(72) Inventors: Tomohiko Niizeki, Miyagi (JP); Takayuki Katsunuma, Miyagi (JP); Yoshihide Kihara, Miyagi (JP); Maju Tomura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/094,861

(22) Filed: Nov. 11, 2020

(65) Prior Publication Data
US 2021/0151301 A1 May 20, 2021

(30) Foreign Application Priority Data

Nov. 19, 2019 (JP) .............................. JP2019-208779

(51) Int. Cl.
*H01L 21/3065* (2006.01)
*H01J 37/32* (2006.01)

(52) U.S. Cl.
CPC .... *H01J 37/32724* (2013.01); *H01J 37/3244* (2013.01); *H01J 37/32091* (2013.01); *H01J 37/32568* (2013.01); *H01L 21/3065* (2013.01); *H01J 2237/334* (2013.01)

(58) Field of Classification Search
CPC ......... H01L 21/31138; H01L 21/31116; H01L 21/31144; H01L 21/3065; H01L 21/32055; H01L 21/67069; H01J 37/32724; H01J 37/32091
See application file for complete search history.

(56) References Cited

U.S. PATENT DOCUMENTS

| | | | |
|---|---|---|---|
| 2009/0045165 A1 | 2/2009 | Narishige et al. | |
| 2012/0244709 A1 | 9/2012 | Igarashi et al. | |
| 2015/0004795 A1 | 1/2015 | Ishii | |
| 2021/0242032 A1* | 8/2021 | Colinjivadi | ....... H01L 21/68785 |

FOREIGN PATENT DOCUMENTS

| | | |
|---|---|---|
| JP | 2009-049141 A | 3/2009 |
| JP | 2012-204668 A | 10/2012 |
| JP | 2015-012178 A | 1/2015 |

OTHER PUBLICATIONS

Merrian Webster, "Organic" via https://www.merriam-webster.com/dictionary/organic pages (Year: 2022).*

* cited by examiner

*Primary Examiner* — Binh X Tran
(74) *Attorney, Agent, or Firm* — Weihrouch IP (57) ABSTRACT

A method for etching a film includes: supplying a precursor gas to the substrate, thereby forming a precursor layer on a substrate; and etching the film with a chemical species from plasma formed from a processing gas so as to increase a depth of the opening, and form a protective region from the precursor layer with the chemical species or another chemical species from the plasma. A plurality of cycles each including the supplying the precursor gas and the etching the film is executed. A temperature of the substrate during execution of the etching the film included in at least one cycle of the plurality of cycles and a temperature of the substrate during execution of the etching the film included in at least one other cycle of the plurality of cycles are set to be different from each other.

19 Claims, 9 Drawing Sheets

FIG. 9

METHOD FOR ETCHING FILM AND PLASMA PROCESSING APPARATUS

CROSS-REFERENCE TO RELATED APPLICATIONS

This application is based on and claims priority from Japanese Patent Application No. 2019-208779 filed on Nov. 19, 2019 with the Japan Patent Office, the disclosure of which is incorporated herein in its entirety by reference.

TECHNICAL FIELD

An exemplary embodiment of the present disclosure relates to a method for etching a film and a plasma processing apparatus.

BACKGROUND

In manufacturing electronic devices, a plasma etching may be performed on a film. In the plasma etching, plasma is generated from a gas in a chamber. The film of a substrate disposed in the chamber is etched by a chemical species from the plasma.

In the plasma etching, in order to prevent an opening formed in the film from expanding in the lateral direction (i.e., a direction orthogonal to the film thickness direction), a protective region may be formed on the side wall surface of the film defining the opening. Technologies including forming a protective region and etching a film are disclosed in, for example, Japanese Laid-Open Patent Publication No. 2012-204668, Japanese Laid-Open Patent Publication No. 2009-049141, and Japanese Laid-Open Patent Publication No. 2015-012178.

An organic film is etched in the technologies disclosed in Japanese Laid-Open Patent Publication No. 2012-204668, Japanese Laid-Open Patent Publication No. 2009-049141, and Japanese Laid-Open Patent Publication No. 2015-012178. In the technologies disclosed in Japanese Laid-Open Patent Publication No. 2012-204668 and Japanese Laid-Open Patent Publication No. 2009-049141, a protective region containing silicon is formed on the side wall surface by sputtering. The protective region protects the organic film from an oxygen chemical species that etches the organic film. In the technology disclosed in Japanese Laid-Open Patent Publication No. 2015-012178, the organic film is etched by the plasma etching using a gas containing carbonyl sulfide, oxygen, and chlorine. When plasma is generated, a sulfur chemical species and a silicon chloride chemical species are generated. The sulfur chemical species and the silicon chloride chemical species form a protective region on the side wall surface. In the technology disclosed in Japanese Laid-Open Patent Publication No. 2015-012178, the protective region is formed at the same time as etching the organic film.

SUMMARY

According to an exemplary embodiment, a method for etching a film is provided. A substrate having a film includes a side wall surface and a bottom surface defining an opening. The method includes a step of supplying a precursor gas to the substrate, thereby forming a precursor layer on the substrate. The method further includes a step of etching the film by a chemical species from plasma generated from a processing gas. In the step of etching the film, a depth of the opening is increased by etching, and also, a protective region is formed from the precursor layer by the chemical species or another chemical species from the plasma. A plurality of cycles respectively including the step of supplying the precursor gas and the step of etching the film is executed. A temperature of the substrate during execution of the step of etching the film included in at least one cycle of the plurality of cycles and a temperature of the substrate during execution of the step of etching the film included in at least one other cycle of the plurality of cycles are set to be different from each other.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various exemplary embodiments will be described.

According to an exemplary embodiment, a method for etching a film is provided. A substrate having a film includes a side wall surface and a bottom surface defining an opening. The method includes a step of supplying a precursor gas to the substrate, thereby forming a precursor layer on the substrate. The method further includes a step of etching the film by a chemical species from plasma generated from a processing gas. In the step of etching the film, a depth of the opening is increased by etching, and also, a protective region is formed from the precursor layer by the chemical species or another chemical species from the plasma. A plurality of cycles respectively including the step of supplying the precursor gas and the step of etching the film is executed. A temperature of the substrate during execution of the step of etching the film included in at least one cycle of the plurality of cycles and a temperature of the substrate during execution of the step of etching the film included in at least one other cycle of the plurality of cycles are set to be different from each other.

In the method according to the exemplary embodiment, the protective region is formed on the side wall surface of the film defining the opening. Therefore, the side wall surface of the film is protected from the chemical species that etches the film. Further, the processing of forming the protective region from the precursor layer is performed at the same time as etching the film. Further, in the method, the temperature of the substrate during the execution of the step of etching the film included in one cycle and the temperature of the substrate during the execution of the step of etching the film included in at least one other cycle of the plurality of cycles are set to be different from each other. As the temperature of the substrate increases in the step of etching the film, the etching amount of the film with respect to the lateral direction increases by the spontaneous reaction. Therefore, it is possible to individually control the etching amount of the film with respect to the lateral direction in the at least one cycle and the etching amount of the film with respect to the lateral direction in the at least one other cycle. Therefore, it is possible to control the width of the opening formed in the film in the depth direction of the opening.

In the method according to the exemplary embodiment, the at least one other cycle may be executed after the at least one cycle. The temperature of the substrate during the execution of the step of etching the film included in the at least one other cycle may be set to be higher than the temperature of the substrate during the execution of the step of etching the film included in the at least one cycle. In the method according to the exemplary embodiment, the at least one other cycle may be executed when etching the film at a position deeper than a position in the depth direction of the film etched in the at least one cycle.

In the method according to the exemplary embodiment, as the execution of the plurality of cycles is proceeded, the protective region may be expanded in the depth direction of the opening along the side wall surface defining the opening.

In the method according to the exemplary embodiment, the substrate may further include a mask provided on the film.

In the method according to the exemplary embodiment, the method may further include a step of reducing the thickness of the protective region by plasma etching between at least two cycles of the plurality of cycles.

In the method according to the exemplary embodiment, the method may further include a step of forming the opening having the bottom surface in the film before executing the plurality of cycles.

In the method according to the exemplary embodiment, the plurality of cycles may be executed in a decompressed space maintained continuously within a chamber of a single plasma processing apparatus without removing the substrate from the chamber.

In the method according to the exemplary embodiment, the plasma processing apparatus may be a capacitively coupled plasma processing apparatus. The plasma processing apparatus may include a chamber, a support, a gas supply, a first radio-frequency power source, and a second radio-frequency power source. The support includes a lower electrode, and is configured to support a substrate in the chamber. The gas supply is configured to supply a precursor gas and a processing gas into the chamber. The upper electrode is provided above the support. The first radio-frequency power source is configured to supply a first radio-frequency power for generating plasma to the upper electrode. The second radio-frequency power source is configured to supply a second radio-frequency power for drawing ions into the substrate to the lower electrode.

In the exemplary embodiment, the film may be an organic film. The chemical species that etches the film may include an oxygen chemical species, and the precursor contained in the precursor layer may be oxidized by the oxygen chemical species. In the exemplary embodiment, the precursor may contain silicon or metal. The metal may be tungsten or titanium.

In the exemplary embodiment, the film may be a low dielectric constant film containing silicon, carbon, oxygen, and hydrogen. The precursor contained in the precursor layer may contain silicon. The chemical species that etches the film may include a fluorine chemical species and a nitrogen chemical species. In the method according to the embodiment, the precursor is nitrided by the nitrogen chemical species.

In the exemplary embodiment, the film may be a low dielectric constant film containing silicon, carbon, oxygen, and hydrogen. The precursor contained in the precursor layer may contain metal. The chemical species that etches the film may include a fluorine chemical species and a nitrogen chemical species. In the method according to the embodiment, the another chemical species may include an oxygen chemical species. In the method according to the embodiment, the precursor is nitrided by the oxygen chemical species. The metal may be tungsten or titanium.

In the exemplary embodiment, the film may be a polycrystalline silicon film. The precursor contained in the precursor layer may contain silicon or metal. The chemical species that etches the film may include a halogen chemical species. The another chemical species may include an oxygen chemical species. In the method according to the embodiment, the precursor is nitrided by the oxygen chemical species. The metal may be tungsten or titanium.

In the exemplary embodiment, the film may be a silicon nitride film. The precursor contained in the precursor layer may contain silicon or metal. The chemical species that etches the film may include a chemical species formed from a hydrofluorocarbon in the processing gas. The another chemical species may include an oxygen chemical species. In the method according to the embodiment, the precursor is nitrided by the oxygen chemical species. The metal may be tungsten or titanium.

In yet another exemplary embodiment, a plasma processing apparatus is provided. The plasma processing apparatus includes a chamber, a support, a gas supply, a plasma generating unit, a temperature adjusting mechanism, and a control unit. The support is configured to support a substrate in the chamber. The gas supply is configured to supply a precursor gas and a processing gas into the chamber. The plasma generating unit is configured to generate plasma of the processing gas. The temperature adjusting mechanism is configured to adjust a temperature of the substrate placed on the support. The control unit is configured to execute a plurality of control cycles respectively including a first control and a second control. The control unit controls the gas supply in the first control such that the precursor gas is supplied into the chamber so as to form a precursor layer on the substrate placed on the support. The control unit controls the gas supply and the plasma generating unit in the second control such that the processing gas is supplied into the chamber, and also, the plasma of the processing gas is generated in the chamber. The second control is executed to increase a depth of an opening provided in the substrate by etching the film of the substrate, and also, form a protective region by altering the precursor layer. The control unit controls the temperature adjusting mechanism such that a temperature of the substrate during execution of the second control in at least one control cycle and a temperature of the substrate during execution of the second control included in at least one other cycle are set to be different from each other.

Hereinafter, various exemplary embodiments will be described in detail with reference to the drawings. In the respective drawings, the same or corresponding parts will be denoted by the same symbols.

Figure 1:
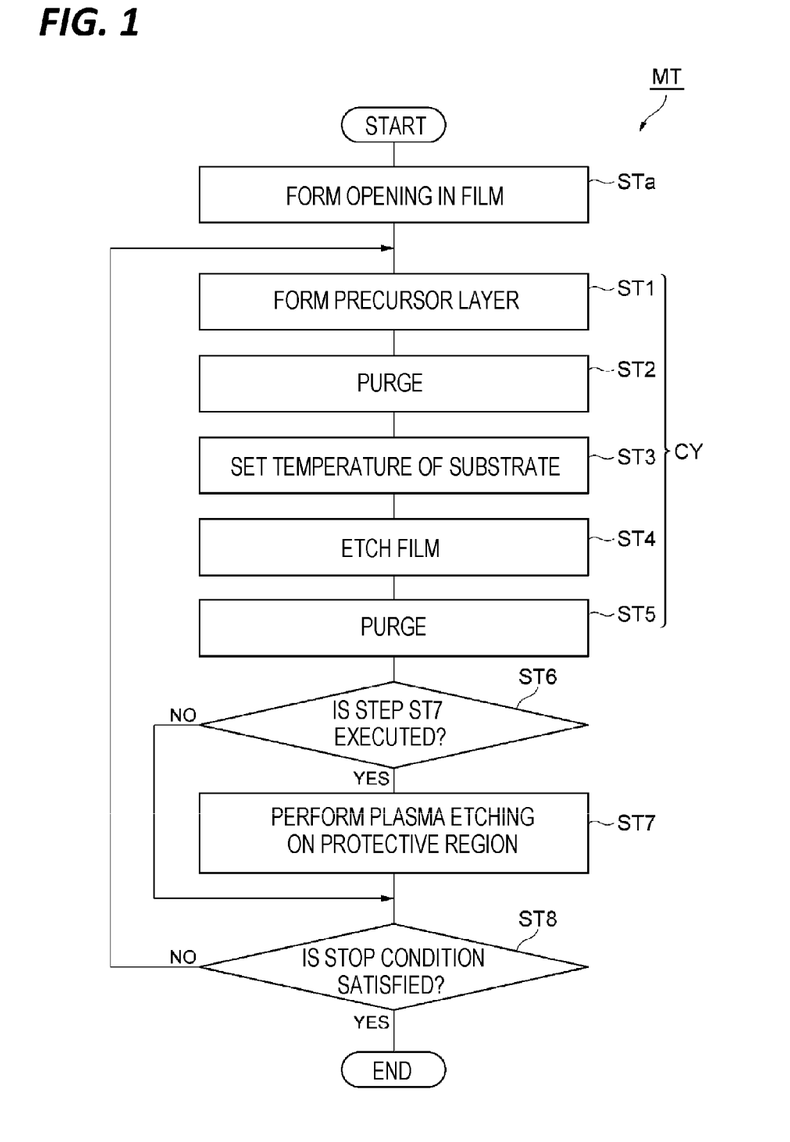
FIG. 1 is a flowchart illustrating a method for etching a film according to an exemplary embodiment.
Figure 2:
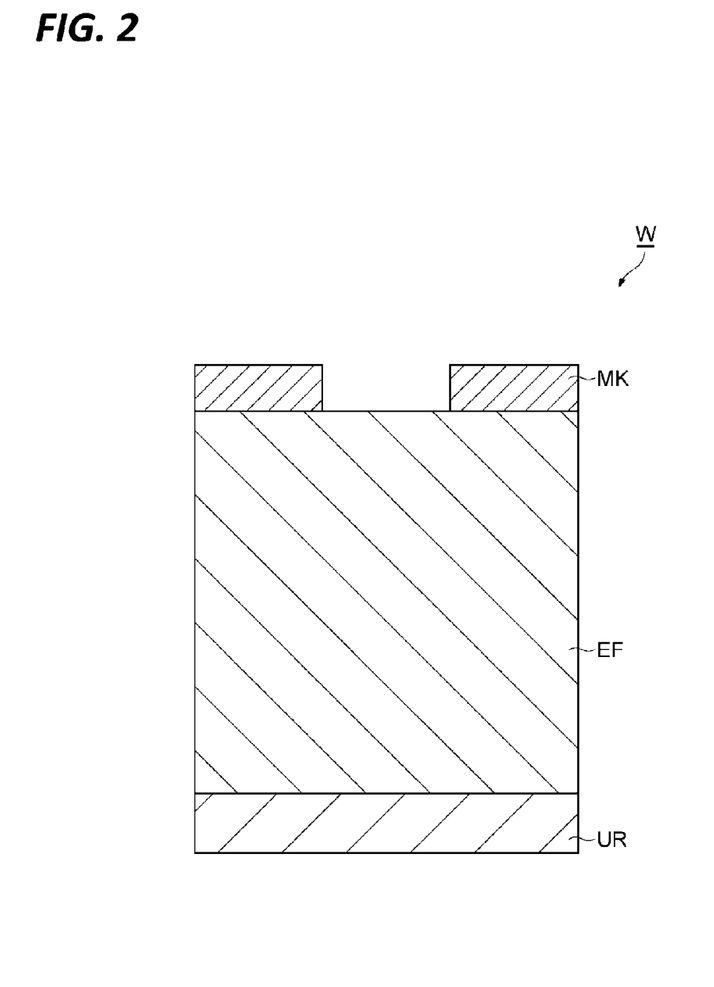
FIG. 2 is a partial enlarged cross-sectional view of an example of a substrate.

FIG. 1 is a flowchart illustrating a method for etching a film according to an exemplary embodiment. The method MT illustrated in FIG. 1 is executed to etch a film of a substrate. FIG. 2 is a partial enlarged cross-sectional view of an example of the substrate. A substrate W illustrated in FIG. 2 includes a film EF. The substrate W may include an underlying region UR and a mask MK.

The film EF is provided on the underlying region UR. The mask MK is provided on the film EF. The mask MK is patterned. That is, the mask MK provides one or more openings. That is, the substrate W includes a side wall surface and a bottom surface defining each of the one or more openings. In the substrate W illustrated in FIG. 2, the mask MK provides the side wall surface and the film EF provides the bottom surface. The film EF is partially exposed from the opening of the mask MK. The film EF may be made of any material. The mask MK may be made of any material as long as the film EF is selectively etched with respect to the mask MK in step ST4 described later.

In Example 1 of the substrate W, the film EF is an organic film. In Example 1 of the substrate W, the mask MK is a silicon-containing film. The silicon-containing film is, for example, an anti-reflective film containing silicon.

In Example 2 of the substrate W, the film EF is a low dielectric constant film containing silicon, carbon, oxygen, and hydrogen. That is, in Example 2 of the substrate W, the film EF is a SiCOH film. In Example 2 of the substrate W, the mask MK is formed of a metal-containing film such as a tungsten-containing film and a titanium-containing film. In Example 2 of the substrate, the mask MK may be formed of an organic film such as a photoresist film, a silicon nitride film, or a polysilicon film.

In Example 3 of the substrate W, the film EF is a polycrystalline silicon film. In Example 3 of the substrate W, the mask MK is formed of a metal-containing film such as a tungsten-containing film and a titanium-containing film. In Example 3 of the substrate, the mask MK may be formed of an organic film such as a photoresist film or a silicon nitride film.

In Example 4 of the substrate W, the film EF is a silicon nitride film. In Example 4 of the substrate W, the mask MK is formed of a metal-containing film such as a tungsten-containing film and a titanium-containing film. In Example 4 of the substrate, the mask MK may be formed of an organic film such as a photoresist film or a polysilicon film.

Figure 3:
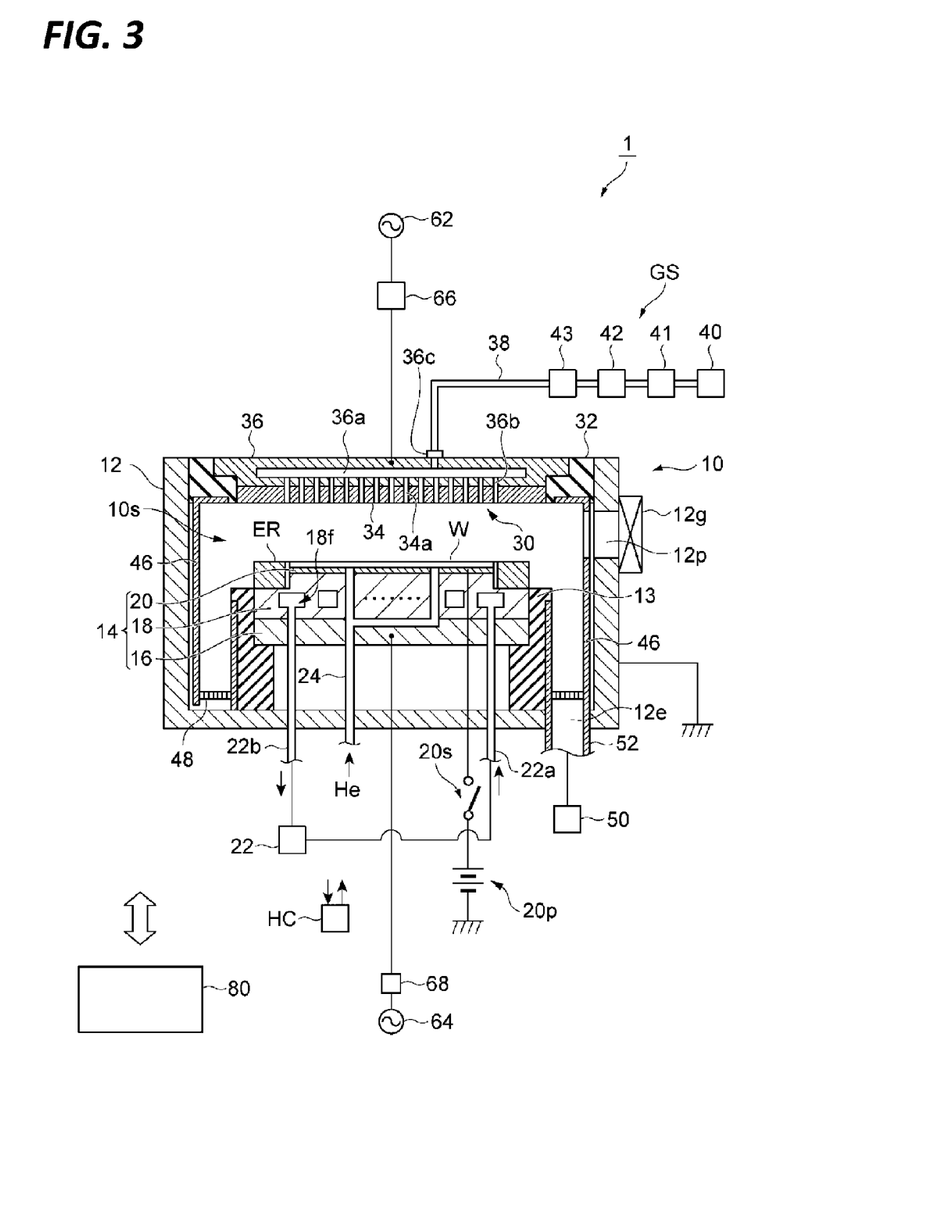
FIG. 3 is a schematic view illustrating a plasma processing apparatus according to an exemplary embodiment.

In the embodiment, the method MT is executed using a plasma processing apparatus. FIG. 3 is a schematic view illustrating the plasma processing apparatus according to an exemplary embodiment. The plasma processing apparatus 1 illustrated in FIG. 1 is a capacitively coupled plasma processing apparatus.

The plasma processing apparatus 1 includes a chamber 10. The chamber 10 provides an internal space 10s therein. The chamber 10 includes a chamber body 12. The chamber body 12 has a substantially cylindrical shape. The internal space 10s is provided inside the chamber body 12. The chamber body 12 is made of, for example, aluminum. A film having corrosion resistance is provided on an inner wall surface of the chamber body 12. The film having corrosion resistance may be a film made of a ceramic such as aluminum oxide or yttrium oxide.

A passage 12p is formed at a side wall of the chamber body 12. The substrate W passes through the passage 12p when being transferred between the internal space 10s and the outside of the chamber 10. The passage 12p may be opened/closed by a gate valve 12g. The gate valve 12g is provided along the side wall of the chamber body 12.

A support 13 is provided on the bottom portion of the chamber body 12. The support 13 is made of an insulating material. The support 13 has a substantially cylindrical shape. The support 13 extends upward from the bottom portion of the chamber body 12 in the internal space 10s. The support 13 supports a support stage 14. The support state 14 is provided in the internal space 10s. The support stage 14 is configured to support the substrate W in the chamber 10, that is, in the internal space 10s.

The support stage 14 includes a lower electrode 18 and an electrostatic chuck 20. The support stage 14 may further include an electrode plate 16. The electrode plate 16 is made of, for example, a conductor such as aluminum, and has a substantially disc shape. The lower electrode 18 is provided on the electrode plate 16. The lower electrode 18 is made of, for example a conductor such as aluminum, and has a substantially disc shape. The lower electrode 18 is electrically connected to the electrode plate 16.

Figure 4:
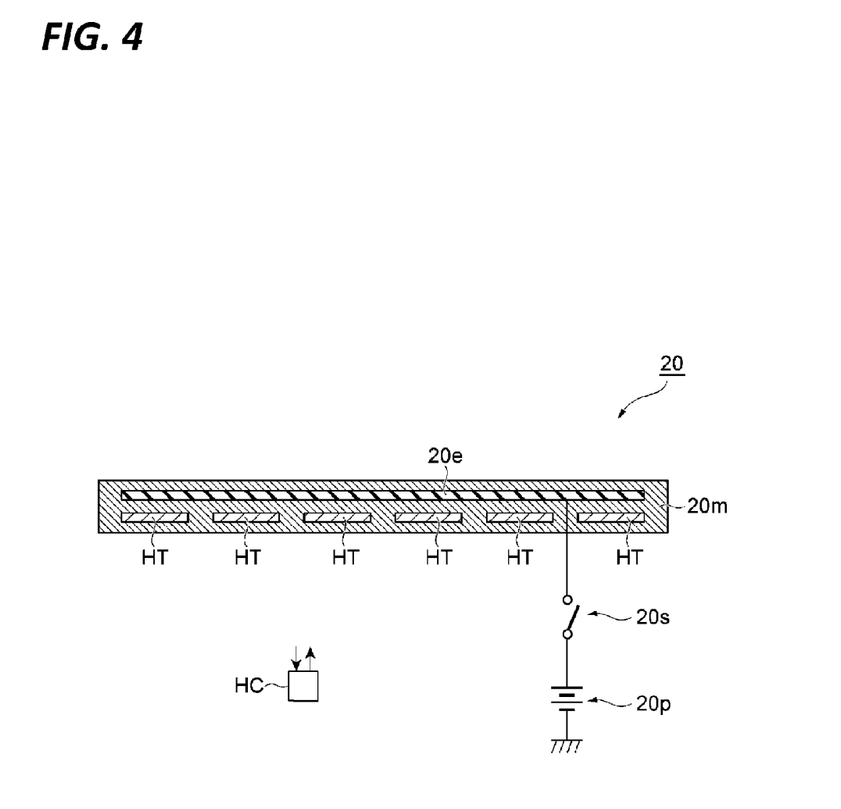
FIG. 4 is an enlarged cross-sectional view of an electrostatic chuck of the plasma processing apparatus according to the exemplary embodiment.

FIG. 4 is an enlarged cross-sectional view of the electrostatic chuck of the plasma processing apparatus according to the exemplary embodiment. In the following, reference will be made to FIGS. 3 and 4. The electrostatic chuck 20 is provided on the lower electrode 18. The substrate W is disposed on the upper surface of the electrostatic chuck 20. The electrostatic chuck 20 includes a body 20m and an electrode 20e. The body 20m has a substantially disc shape, and is made of a dielectric material. The electrode 20e is a film shape electrode, and is provided in the body 20m. The electrode 20e is connected to a DC power source 20p through a switch 20s. When a voltage from the DC power source 20p is applied to the electrode 20e, an electrostatic attractive force is generated between the electrostatic chuck 20 and the substrate W. Due to the generated electrostatic attractive force, the substrate W is attracted to the electrostatic chuck 20 and held by the electrostatic chuck 20.

The support stage 14 may include one or more heaters HT. Each of the one or more heaters HT may be a resistance heating element. The plasma processing apparatus 1 may further include a heat controller HC. Each of the one or more heaters HT generates heat according to the electric power individually applied from the heater controller HC. As a result, the temperature of the substrate W on the support stage 14 is adjusted. One or more heaters HT constitute a temperature adjusting mechanism of the plasma processing apparatus 1. In the embodiment, the support stage 14 includes a plurality of heaters HT. The plurality of heaters HT are provided in the electrostatic chuck 20.

An edge ring ER is disposed on a periphery of the support stage 14 to surround an edge of the substrate W. The substrate W is disposed on the electrostatic chuck 20 and also in the region surrounded by the edge ring ER. The edge ring ER is used to improve the in-plane uniformity of the plasma processing on the substrate W. The edge ring ER may be made of silicon, silicon carbide, or quartz, but not limited thereto.

A flow path 18f is provided inside the lower electrode 18. A heat exchange medium (e.g., a refrigerant) is supplied to the flow path 18f through a pipe 22a from a chiller unit 22 provided outside the chamber 10. The heat exchange medium supplied to the flow path 18f returns to the chiller unit 22 through a pipe 22b. In the plasma processing apparatus 1, the temperature of the substrate W placed on the electrostatic chuck 20 is adjusted by the heat exchange between the heat exchange medium and the lower electrode 18. The chiller unit 22 may also constitute the temperature adjusting mechanism of the plasma processing apparatus 1.

A gas supply line 24 is provided in the plasma processing apparatus 1. The gas supply line 24 supplies a heat transfer gas (e.g., He gas) from a heat transfer gas supply mechanism to a gap between the upper surface of the electrostatic chuck 20 and the rear surface of the substrate W.

The plasma processing apparatus 1 further includes an upper electrode 30. The upper electrode 30 is provided above the support stage 14. The upper electrode 30 is supported in the upper portion of the chamber body 12 through a member 32. The member 32 is made of an insulating material. The upper electrode 30 and the member 32 close the upper opening of the chamber body 12.

The upper electrode 30 may include a top plate 34 and a support body 36. A lower surface of the top plate 34 is the lower surface on the internal space 10s side, and defines the internal space 10s. The top plate 34 may be made of a low resistance conductor or a semiconductor generating low Joule heat. A plurality of gas discharge holes 34a is formed in the top plate 34. The plurality of gas discharge holes 34a penetrate the top plate 34 in the plate thickness direction.

The support body 36 detachably supports the top plate 34. The support body 36 is made of a conductive material such as aluminum. A gas diffusion chamber 36a is provided inside the support body 36. A plurality of gas holes 36b is formed in the support body 36. The plurality of gas holes 36b extend downward from the gas diffusion chamber 36a. The plurality of gas holes 36b communicate with the plurality of gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

The gas supply pipe 38 is connected with a gas source group 40 through a valve group 41, a flow rate controller group 42, and a valve group 43. The gas source group 40, the valve group 41, the flow rate controller group 42, and the valve group 43 constitute a gas supply GS. The gas source group 40 includes a plurality of gas sources. The plurality of gas sources of the gas source group 40 includes sources of a plurality of gases used in the method MT. Each of the valve group 41 and the valve group 43 includes a plurality of opening/closing valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through the opening/closing valves corresponding to the valve group 41, the flow rate controllers corresponding to the flow rate controller group 42, and the opening/closing valves corresponding to the valve group 43.

The plasma processing apparatus 1 may further include a shield 46. The shield 46 is provided detachably along the inner wall surface of the chamber body 12. The shield 46 is provided in the outer periphery of the support 13 as well. The shield 46 prevents etching byproducts from being adhered to the chamber body 12. The shield 46 is formed by forming a film having corrosion resistance on the surface of a member made of, for example, aluminum. The film having corrosion resistance may be a film made of a ceramic such as yttrium oxide.

A baffle plate 48 is provided between the support 13 and the side wall of the chamber body 12. The baffle plate 48 is formed by forming a film having corrosion resistance on the surface of a member made of, for example, aluminum. The film having corrosion resistance may be a film made of a ceramic such as yttrium oxide. A plurality of through-holes is formed in the baffle plate 48. An exhaust port 12e is provided at the lower side of the baffle plate 48, and at the bottom portion of the chamber body 12 as well. An exhaust device 50 is connected to the exhaust port 12e through an exhaust pipe 52. The exhaust device 50 includes a vacuum pump such as a pressure adjusting valve and a turbo molecular pump.

The plasma processing apparatus 1 further includes a first radio-frequency power source 62 and a second radio-frequency power source 64. The first radio-frequency power source 62 is a power source that generates a first radio-frequency power. The first radio-frequency power has a frequency suitable for plasma generation. The frequency of the first radio-frequency power is, for example, a frequency within a range of 27 MHz to 100 MHz. The first radio-frequency power source 62 is connected to the upper electrode 30 via a matcher 66 and the electrode plate 16. The matcher 66 includes a circuit to match the output impedance of the first radio-frequency power source 62 and the impedance of the load side (the upper electrode 30 side). The first radio-frequency power source 62 may be connected to the lower electrode 18 via the matcher 66. The first radio-frequency power source 62 constitutes an example of a plasma generating unit.

The second radio-frequency power source 64 is a power source that generates a second radio-frequency power. The second radio-frequency power has a frequency lower than the frequency of the first radio-frequency power. When the second radio-frequency power is used together with the first radio-frequency power, the second radio-frequency power is used as a bias radio-frequency power for drawing ions into the substrate W. The frequency of the second radio-frequency power is, for example, a frequency within a range of 400 kHz to 13.56 MHz. The second radio-frequency power source 64 is connected to the lower electrode 18 via a matcher 68 and the electrode plate 16. The matcher 68 includes a circuit to match the output impedance of the second high frequency power source 64 and the input impedance of the load side (the lower electrode 18 side).

It is possible to generate plasma using the second radio-frequency power without using the first radio-frequency power, that is, using a single radio-frequency power. In this case, the frequency of the second radio-frequency power may be a frequency larger than 13.56 MHz, for example, 40 MHz. In this case, the plasma processing apparatus 1 may include the first radio-frequency power source 62 and the matcher 66. In this case, the second radio-frequency power source 64 constitutes an example of a plasma generating unit.

In the plasma processing apparatus 1, when plasma is generated, a gas is supplied from the gas supply GS to the internal space 10s. Further, a radio-frequency electric field is generated between the upper electrode 30 and the lower electrode 18 by supplying the first radio-frequency power and/or the second radio-frequency power. The gas is excited by the radio-frequency electric field. As a result, plasma is generated.

The plasma processing apparatus 1 may further include a control unit 80. The control unit 80 may be a computer including, for example, a processor, a storage unit such as a memory, an input device, a display device, and a signal input/output interface. The control unit 80 controls each part of the plasma processing apparatus 1. In the control unit 80, an operator may execute an input operation of a command using the input device to manage the plasma processing apparatus 1. Further, in the control unit 80, the operation status of the plasma processing apparatus 1 may be visualized and displayed by the display device. Further, a control program and a recipe data are stored in the storage unit of the control unit 80. The control program is executed by the processor of the control unit 80, in order to execute various processes in the plasma processing apparatus 1. The processor of the control unit 80 executes the control program and controls each part of the plasma processing apparatus 1 according to the recipe data, whereby the method MT is executed in the plasma processing apparatus 1.

Referring back to FIG. 1, the method MT will be described in detail. In the following descriptions, the method MT will be described by taking the case where the substrate W illustrated in FIG. 2 is processed using the plasma processing apparatus 1 as an example. In the method MT, other plasma processing apparatuses may be used. In the method MT, other substrates may be processed.

The method MT is executed in a state where the substrate W is placed on the support stage 14. In the embodiment, the method MT may start with step STa. In step STa, the film EF is etched by plasma etching.

In step STa, plasma Pa is generated from a processing gas in the chamber 10. When Example 1 of the substrate W described above is processed, that is, the film EF of the substrate W is an organic film, the processing gas used in step STa may contain an oxygen-containing gas. The oxygen-containing gas includes, for example, an oxygen gas, a carbon monoxide gas, or a carbon dioxide gas. Alternatively, when Example 1 of the substrate W is processed, the processing gas used in step STa may contain a nitrogen gas and/or a hydrogen gas.

When Example 2 of the substrate W described above is processed, that is, the film EF of the substrate W is a low dielectric constant film, the processing gas used in step STa may contain a fluorine-containing gas. The fluorine-containing gas is, for example, a fluorocarbon gas. The fluorocarbon gas is, for example, $C_4F_8$ gas.

When Example 3 of the substrate W described above is processed, that is, the film EF of the substrate W is a polycrystalline silicon film, the processing gas used in step STa may contain a halogen-containing gas. The halogen-containing gas is, for example, HBr gas, $Cl_2$ gas, or $SF_6$ gas.

When Example 4 of the substrate W described above is processed, that is, the film EF of the substrate W is a silicon nitride film, the processing gas used in step STa may contain a hydrofluorocarbon gas. The hydrofluorocarbon gas is, for example, $CH_3F$ gas.

Figure 5A:
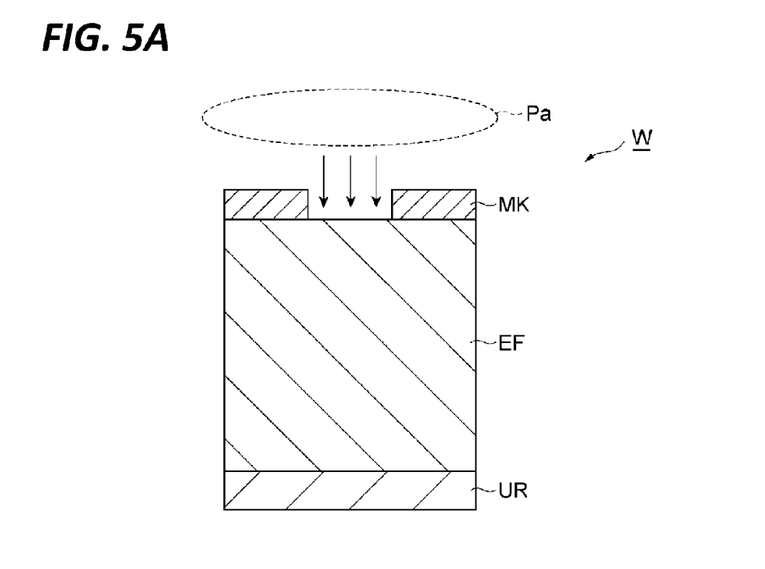
FIG. 5A is a view for explaining an example of step STa of the method illustrated in FIG. 1.
Figure 5B:
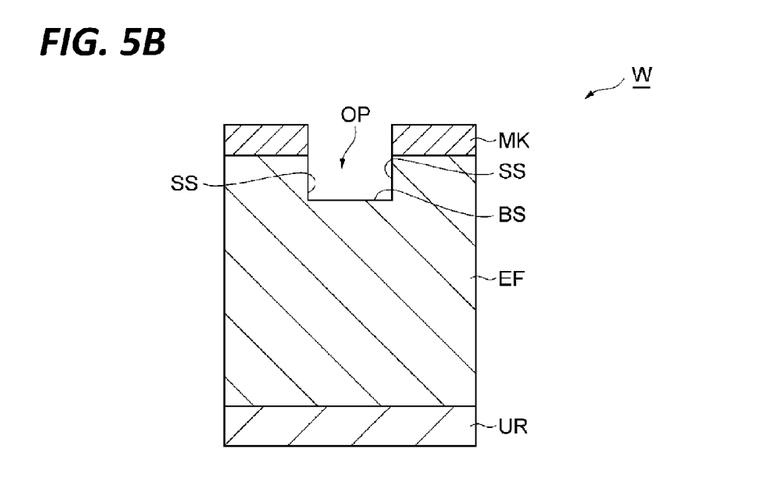
FIG. 5B is a partial enlarged cross-sectional view of the example of the substrate in a state after step STa is executed.

In step STa, as illustrated in FIG. 5A, a chemical species from the plasma Pa is irradiated to the film EF, and the film EF is etched by the chemical species. In step STa, the film EF is etched to the position between the lower surface of the film EF and the upper surface of the film EF. The lower surface of the film EF is a surface of the film EF that comes into contact with the underlying region UR. The upper surface of the film EF is a surface of the film EF that is exposed from the opening of the mask MK. When step STa is executed, as illustrated in FIG. 5B, an opening OP is formed in the film EF. The opening OP is defined by a side wall surface SS and a bottom surface BS of the film EF.

In step STa, the control unit 80 controls the exhaust device 50 so as to set the pressure of the gas in the chamber 10 to a designated pressure. In step STa, the control unit 80 controls the gas supply GS so as to supply the processing gas into the chamber 10. In step STa, the control unit 80 controls the plasma generating unit so as to generate plasma from the processing gas. In step STa in the embodiment, the control unit 80 controls the first radio-frequency power source 62 and/or the second radio-frequency power source 64 so as to supply the first radio-frequency power and/or the second radio-frequency power.

The plasma etching in step STa may be the same plasma etching as the plasma etching in step ST4 described later. In this case, regarding the details of the plasma etching in step STa and the control by the control unit 80 in step STa, see the descriptions of step ST4.

The method MT may not include step STa. In this case, the film EF of the substrate to which the method MT is applied is provided with the opening OP in advance. Alternatively, when the method MT does not include step STa, a plurality of cycles CY described later may be applied with respect to the substrate W illustrated in FIG. 2.

The method MT includes executing the plurality of cycles CY. Each of the plurality of cycles CY includes step ST1 and step ST4. The plurality of cycles CY are applied to the substrate W having an opening. In the embodiment, as illustrated in FIG. 5B, the plurality of cycles CY are applied to the substrate W having the opening OP defined by the side wall surface SS and the bottom surface BS. In order to execute the method MT, the control unit 80 executes a plurality of control cycles respectively including a first control and a second control.

Figure 6:
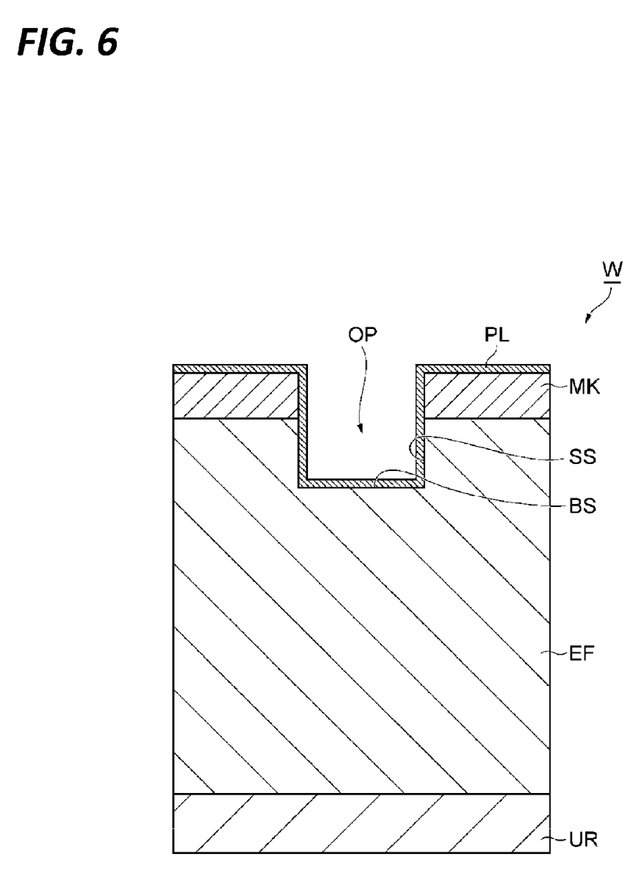
FIG. 6 is a partial enlarged cross-sectional view of the example of the substrate in a state after step ST1 of the method illustrated in FIG. 1 is executed.

In step ST1, a precursor layer PL is formed on the substrate W. The precursor layer PL is formed on the surface of the substrate W defining the opening. In the embodiment, as illustrated in FIG. 6, the precursor layer PL is formed on the surface of the film EF defining the opening OP. The surface of the film EF includes the side wall surface and the bottom surface defining the opening OP. The precursor layer PL is also formed on the mask MK. The precursor contained in the precursor layer PL is altered during execution of step ST4 described later to form a protective region PR. The precursor contained in the precursor layer PL may be any precursor as long as the protective region PR protects the side wall surface defining the opening OP from the active species that etches the film EF.

In step ST1, a precursor gas is supplied to the substrate W including the opening OP. In the embodiment, the precursor gas is supplied to the internal space 10s. In step ST1, a carrier gas may be supplied together with the precursor gas. The carrier gas may be an inert gas. The inert gas is, for example, a rare gas or a nitrogen gas. During execution of step ST1, plasma is not generated in the chamber 10.

When any one of Examples 1 to 4 of the substrate W described above is processed, the precursor gas used in step ST1 is a silicon-containing gas or a metal-containing gas. The silicon-containing gas contains a silicon-containing substance as a precursor. The silicon-containing gas is, for example, an aminosilane gas. The metal-containing gas contains a metal-containing substance as a precursor. The metal-containing substance includes, for example, tungsten or titanium. The metal-containing gas is, for example, a tungsten-containing gas or a titanium-containing gas. The tungsten-containing gas may be a tungsten halogenide gas such as a tungsten hexafluoride gas or a tungsten hexachloride gas. The titanium-containing gas may be a titanium halogenide gas such as a titanium tetrafluoride gas or a titanium tetrachloride gas.

In step ST1, the control unit 80 executes the first control. In the first control, the control unit 80 controls the gas supply GS so as to supply the precursor gas into the chamber 10. In the first control, the control unit 80 controls the exhaust device 50 so as to set the pressure of the gas in the chamber 10 to a designated pressure. In the first control, the control unit 80 may supply the carrier gas together with the precursor gas into the chamber 10. The carrier gas is an inert gas. The inert gas is, for example, a rare gas or a nitrogen gas.

In the method MT, step ST2 may be executed between step ST1 and step ST4. In step ST2, the internal space 10s is purged. In step ST2, the control unit 80 controls the exhaust device 50 so as to exhaust the internal space 10s. In step ST2, the control unit 80 may control the gas supply GS so as to supply the inert gas into the chamber 10. The precursor gas in the chamber 10 is substituted with the inert gas by executing step ST2. Excessive precursor absorbed on the substrate W may be removed by executing step ST2. In this case, the precursor layer PL is formed as a result of the supply of the precursor gas in step ST1 and the purging in step ST2. The precursor layer PL may be a monomolecular layer.

Figure 7A:
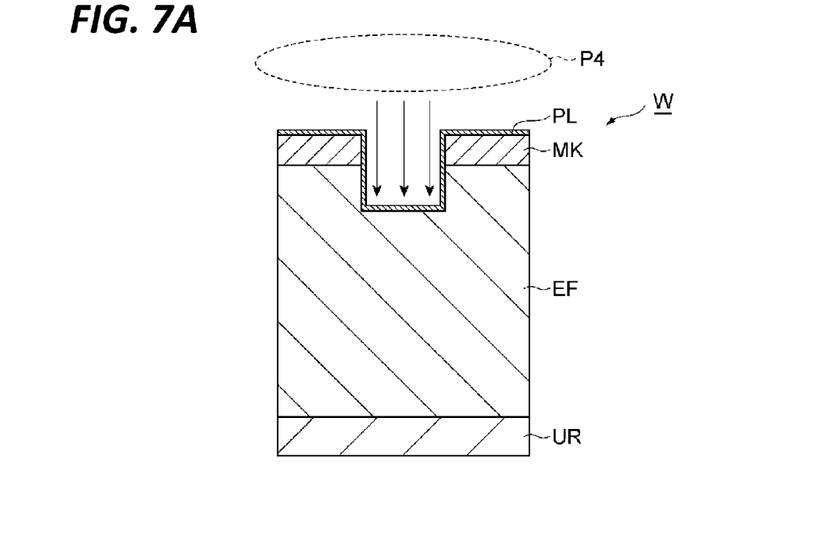
FIG. 7A is a view for explaining an example of step ST4 of the method illustrated in FIG. 1.
Figure 7B:
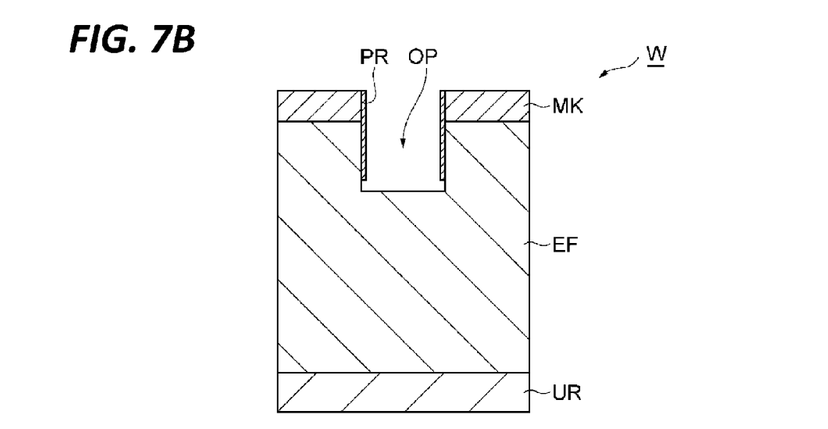
FIG. 7B is a partial enlarged cross-sectional view of the example of the substrate in a state after step ST4 is executed.

In each of the plurality of cycles CY, step ST4 is executed after step ST1. As illustrated in FIG. 1, in the embodiment, step ST4 may be executed after step ST2. In step ST4, the film EF is etched by plasma etching. In step ST4, plasma P4 is generated from the processing gas in the chamber 10. In step ST4, as illustrated in FIG. 7A, the film EF is irradiated by an active species from the plasma P4, and the film EF is etched as illustrated in FIG. 7B. In step ST4, the precursor contained in the precursor layer PL reacts with the chemical species that etches the film EF or another chemical species from the plasma P4. As a result, the protective region PR is formed from the precursor layer PL. The protective region PR extends on the side wall surface of the substrate W defining the opening.

When Example 1 of the substrate W described above is processed, that is, the film EF of the substrate W is an organic film, the processing gas used in step ST4 may contain an oxygen-containing gas. The oxygen-containing gas includes, for example, an oxygen gas, a carbon monoxide gas, or a carbon dioxide gas. The processing gas may further contain a carbonyl sulfide gas. When Example 1 of the substrate W is processed, the film EF is etched by an oxygen chemical species from the plasma P4. Further, the protective region PR is formed by the reaction between the oxygen chemical species from the plasma P4 and the precursor contained in the precursor layer PL. When the precursor contained in the precursor layer PL is a silicon-containing substance, the protective region PR is made of silicon oxide. When the precursor contained in the precursor layer PL is a metal-containing substance, the protective region PR is made of metal oxide (e.g., tungsten oxide or titanium oxide).

When Example 2 of the substrate W described above is processed, that is, the film EF of the substrate W is a low dielectric constant film, the processing gas used in step ST4 may contain fluorine and nitrogen. For example, the processing gas contains a fluorocarbon gas and a nitrogen-containing gas. The fluorocarbon gas is, for example, $C_4F_8$ gas. The nitrogen-containing gas is, for example, a nitrogen gas ($N_2$ gas). The processing gas may further contain a rare gas (e.g., Ar gas) and an oxygen gas ($O_2$ gas). When Example 2 of the substrate W is processed, the film EF is etched by a fluorine chemical species and a nitrogen chemical species from the plasma P4. When the precursor contained in the precursor layer PL is a silicon-containing substance, in step ST4, the protective region PR is formed by the reaction between the nitrogen chemical species from the plasma P4 and the silicon-containing substance contained in the precursor layer PL. In this case, the protective region PR is made of silicon oxide. When the precursor contained in the precursor layer PL is a metal-containing substance, in step ST4, the protective region PR is formed by the reaction between the oxygen chemical species from the plasma P4 and the metal-containing substance contained in the precursor layer PL. In this case, the protective region PR is made of metal oxide (e.g., tungsten oxide or titanium oxide). The oxygen chemical species from the plasma P4 reduces the amount of carbon-containing deposits formed on the substrate W in step ST4.

When Example 3 of the substrate W described above is processed, that is, the film EF of the substrate W is a polycrystalline silicon film, the processing gas used in step ST4 may contain a halogen-containing gas and an oxygen-containing gas. The halogen-containing gas is HBr gas, $Cl_2$ gas, or $SF_6$ gas. The oxygen-containing gas includes, for example, an oxygen gas, a carbon monoxide gas, or a carbon dioxide gas. When Example 3 of the substrate W is processed, the film EF is etched by a halogen chemical species from the plasma P4. Further, the protective region PR is formed by the reaction between the oxygen chemical species from the plasma P4 and the precursor contained in the precursor layer PL. When the precursor contained in the precursor layer PL is a silicon-containing substance, the protective region PR is made of silicon oxide. When the precursor contained in the precursor layer PL is a metal-containing substance, the protective region PR is made of metal oxide (e.g., tungsten oxide or titanium oxide).

When Example 4 of the substrate W described above is processed, that is, the film EF of the substrate W is a silicon nitride film, the processing gas used in step ST4 may contain a hydrofluorocarbon gas and an oxygen-containing gas. The hydrofluorocarbon gas is, for example, $CH_3F$ gas. The oxygen-containing gas includes, for example, an oxygen gas, a carbon monoxide gas, or a carbon dioxide gas. The processing gas may further contain a rare gas (e.g., Ar gas). When Example 4 of the substrate W is processed, the film EF is etched by a chemical species formed from the hydrofluorocarbon gas in the processing gas. Further, the protective region PR is formed by the reaction between the oxygen chemical species from the plasma P4 and the precursor contained in the precursor layer PL. When the precursor contained in the precursor layer PL is a silicon-containing substance, the protective region PR is made of silicon oxide. When the precursor contained in the precursor layer PL is a metal-containing substance, the protective region PR is made of metal oxide (e.g., tungsten oxide or titanium oxide). The oxygen chemical species from the plasma P4 reduces the amount of carbon-containing deposits formed on the substrate W in step ST4.

In step ST4, the control unit 80 executes the second control. In the second control, the control unit 80 controls the gas supply GS so as to supply the processing gas into the internal space 10s. In the second control, the control unit 80 controls the exhaust device 50 so as to set the pressure of the gas in the chamber 10 to a designated pressure. In the second control, the control unit 80 controls the plasma generating unit so as to generate plasma from the processing gas. In the second control in the embodiment, the control unit 80 controls the first radio-frequency power source 62 and/or the second radio-frequency power source 64 so as to supply the first radio-frequency power and/or the second radio-frequency power.

In the method MT, the protective region PR is formed on the side wall surface of the film EF defining the opening OP. The process of forming the protective region PR from the precursor layer PL is performed at the same time as the etching of the film EF. The protective region PR protects the side wall surface of the film EF from the chemical species that etches the film EF. Therefore, the opening OP is prevented from expanding in the lateral direction (i.e., the direction orthogonal to the film thickness direction of the film EF) due to the etching of the side wall surface by the chemical species that etches the film EF.

In the method MT, step ST5 may be executed after executing step ST4. In step ST5, the internal space 10s is purged. Step ST5 is the same step as step ST2.

In the embodiment, step ST6 may be executed after each cycle CY is executed. In step ST6, it is determined whether step ST7 is executed. Step ST7 is executed after step ST6 when it is necessary to be executed. Meanwhile, when step ST7 is not executed, the process proceeds to step ST8. That is, in the embodiment, step ST7 is executed between at least two cycles CY among the plurality of cycles CY.

In step ST7, the thickness of the protective region PR is reduced by the plasma etching. In step ST7, plasma is formed from the processing gas in the chamber 10. The processing gas used in step ST7 contains a chemical species that etches the protective region PR. The chemical species may be a chemical species that selectively etches the protective region PR with respect to the mask MK and the film EF, but not limited thereto. In step ST7, the protective region PR may be partially removed. Alternatively, in step ST7, the entire protective region PR may be removed.

In step ST7, the control unit 80 controls the exhaust device 50 so as to set the pressure of the gas in the chamber 10 to a designated pressure. In step ST7, the control unit 80 controls the gas supply GS so as to supply the processing gas into the chamber 10. In step ST7, the control unit 80 controls the plasma generating unit so as to generate plasma from the processing gas. In step ST7 in the embodiment, the control unit 80 controls the first radio-frequency power source 62 and/or the second radio-frequency power source 64 so as to supply the first radio-frequency power and/or the second radio-frequency power.

Figure 8A:
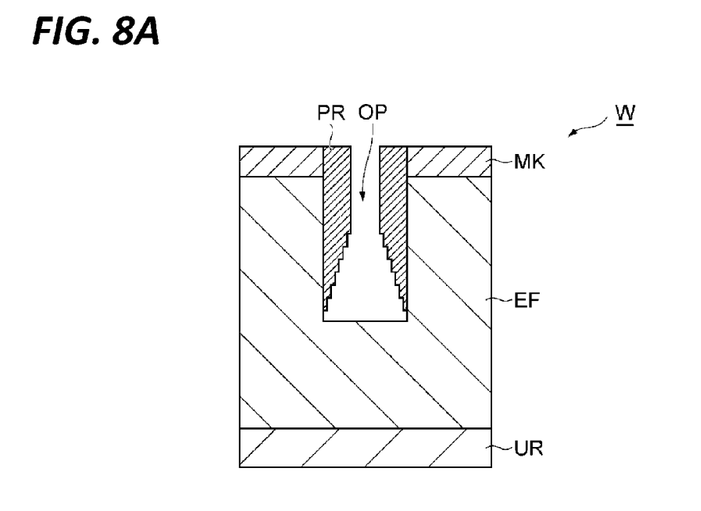
FIG. 8A is a partial enlarged cross-sectional view of the example of the substrate in a state after step ST4 is executed.
Figure 8B:
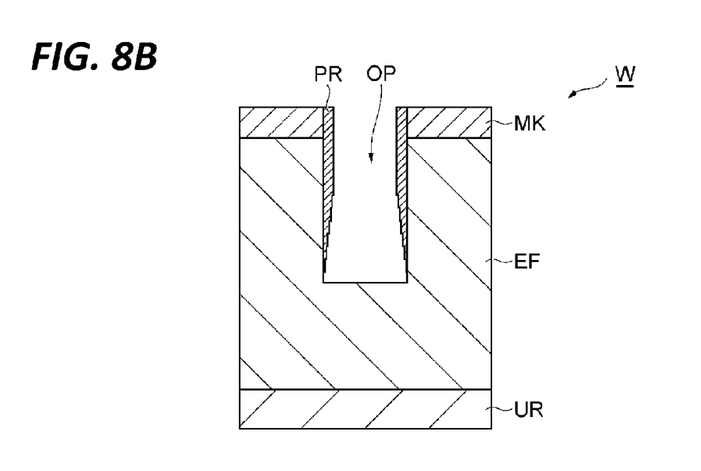
FIG. 8B is a partial enlarged cross-sectional view of the example of the substrate in a state after step ST7 is executed.

As the execution of the plurality of cycles CY progresses, as illustrated in FIG. 8A, the thickness of the protective region PR may be increased so as to narrow the width of the upper end of the opening OP. When step ST7 is executed between at least two cycles CY, as illustrated in FIG. 8B, the thickness of protective region PR is reduced. As a result, ions from the plasma P4 easily reach the deep portion of the opening OP in step ST4 executed after step ST7. Therefore, it is possible to prevent the width of the opening OP from being narrowed in the deep portion.

Figure 9:
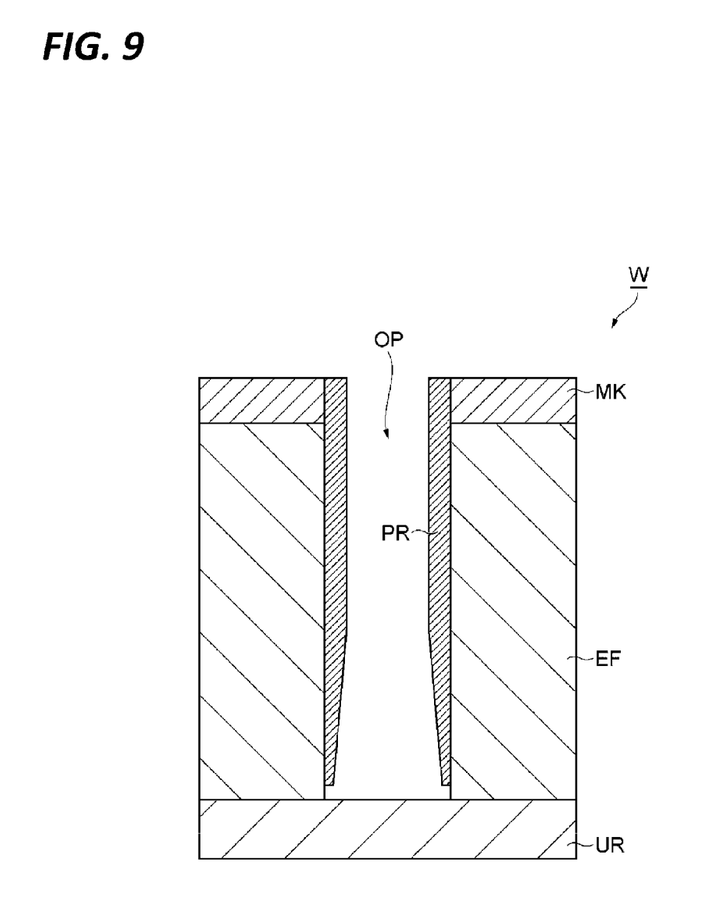
FIG. 9 is a partial enlarged cross-sectional view of the example of the substrate in a state after the method illustrated in FIG. 1 is executed.

In step ST8, it is determined whether a stop condition is satisfied. It is determined that the stop condition is satisfied when the execution of the plurality of cycles CY is ended. In other words, when it is necessary to further execute the cycle CY, the stop condition is not satisfied. In step ST8, the cycle CY is executed again when it is determined that the stop condition is not satisfied. In the re-execution of the cycle CY, the control unit 80 re-executes the control cycle including the first control and the second control. As the execution of the plurality of cycles CY is proceeded, the depth of the opening OP increases. Further, as the execution of the plurality of cycles CY is proceeded, the protective region PR is expanded in the depth direction of the opening OP along the side wall surface defining the opening OP. In step ST8, when it is determined that the stop condition is satisfied, the method MT is ended. In the embodiment, when the method MT is ended, as illustrated in FIG. 9, the opening OP reaches the surface of the underlying region UR.

As illustrated in FIG. 1, each of the plurality of cycles CY further includes step ST3. In step ST3, the temperature of the substrate W placed on the support stage 14 is adjusted. The temperature of the substrate W adjusted in step ST3 may be maintained during the execution of step ST4. In each of the plurality of cycles CY, the temperature adjustment of the substrate W in step ST3 is started before step ST4 or at the same time as the start of step ST4. In FIG. 1, step ST3 is started between step ST2 and step ST4. Step ST3 may be started before step ST1 or after the execution start time of step ST1.

The temperature of the substrate W adjusted in step ST3 included in at least one cycle CY of the plurality of cycles CY and the temperature of the substrate W adjusted in step ST3 included in at least one other cycle CY of the plurality of cycles CY are set to be different from each other. That is, the temperature of the substrate W during the execution of step ST4 included in at least one cycle CY and the temperature of the substrate W during the execution of step ST4 included in at least one other cycle CY are set to be different from each other. For the execution of step ST3, the control unit 80 controls the above described temperature adjusting mechanism of the plasma processing apparatus 1. As the temperature of the substrate W increases during the execution of step ST4, the etching amount of the film EF in the lateral direction increases by the spontaneous reaction. Therefore, it is possible to individually control the etching amount of the film EF in the lateral direction in the at least one cycle CY and the etching amount of the film EF in the lateral direction in the at least one other cycle CY. Therefore, it is possible to control the width of the opening OP formed in the film EF in the depth direction of the opening OP.

In the embodiment, the at least one other cycle CY may be executed after the at least one cycle CY. The temperature of the substrate W during the execution of step ST4 included in the at least one other cycle CY may be set to be higher than the temperature of the substrate W during the execution of step ST4 included in the at least one cycle CY. In the embodiment, the at least one other cycle CY may be executed when etching the film EF at a position deeper than a position in the depth direction of the film EF etched in the at least one cycle CY. According to the embodiment, it is possible to increase the etching amount of the film EF in the lateral direction after the width of the protective region PR in the opening OP is increased. As a result, it is possible to enhance the uniformity of the width of the opening OP in the depth direction.

In the embodiment, the plurality of cycles CY may be executed without removing the substrate W from the chamber 10. That is, the plurality of cycles CY may be executed in the decompressed space maintained continuously within the chamber of a single plasma processing apparatus without removing the substrate W from the chamber. According to the embodiment, the throughput of the method MT is increased.

Although various exemplary embodiments have been described above, the present disclosure is not limited to the exemplary embodiments described above, and various additions, omissions, substitutions, and modifications may be made. Further, it is possible to combine the elements in different embodiments to form other embodiments.

For example, the apparatus used for executing step ST1 and the plasma processing apparatus used for executing step ST4 may be different apparatuses. The apparatus used for executing step STa may also be different from the apparatus used for executing step ST1 and the plasma processing apparatus used for executing step ST4.

Further, the plasma processing apparatus used for executing the method MT may be any type of a plasma processing apparatus. For example, the plasma processing apparatus used for executing the method MT may be a capacitively coupled plasma processing apparatus other than the plasma processing apparatus 1. The plasma processing apparatus used for executing the method MT may be an inductively coupled plasma processing apparatus, an electron cyclotron resonance (ECR) plasma processing apparatus, or a plasma processing apparatus that uses surface waves such as microwaves for generating plasma.

Further, the temperature of the substrate W during the execution of each of the plurality of cycles CY (or step ST4 in the cycle) may be set to be equal to the temperature of the substrate W during the execution of other cycle (or step ST4 in the cycle) included in the plurality of cycles CY. That is, the plurality of cycles CY may be executed without changing the temperature of the substrate W. Further, in the method MT, step ST1 and step ST4 may be executed only once. That is, in the method MT, a sequence including step ST1 and step ST4 may be executed only once.

According to the exemplary embodiment, a technology that protects a side wall surface of a film, and controls a width of an opening formed in the film in a depth direction of the opening is provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for etching a film, comprising:
   supplying a precursor gas to a substrate provided with the film and including a side wall surface and a bottom surface defining an opening, thereby forming a precursor layer on the substrate; and
   etching the film with a chemical species from plasma formed from a processing gas so as to increase a depth of the opening, and form a protective region from the precursor layer with the chemical species or another chemical species from the plasma,
   wherein a plurality of cycles each including the supplying the precursor gas and the etching the film is executed, and
   a temperature of the substrate during execution of the etching the film included in at least one cycle of the plurality of cycles and a temperature of the substrate during execution of the etching the film included in at least one other cycle of the plurality of cycles are set to be different from each other.

2. The method according to claim 1, wherein:
   the precursor layer includes silicon or a metal; and
   the forming of the protective region includes oxidizing or nitriding the precursor layer simultaneous with the etching the film by reacting the chemical species or the another chemical species of the plasma with the precursor layer.

3. The method according to claim 1, wherein the at least one other cycle is executed after the at least one cycle, and
   the temperature of the substrate during the execution of the etching the film included in the at least one other cycle is set to be higher than the temperature of the substrate during the execution of the etching the film included in the at least one cycle.

4. The method according to claim 3, wherein the at least one other cycle is executed when etching the film at a position deeper than a position in a depth direction of the film etched in the at least one cycle.

5. The method according to claim 4, wherein, as the execution of the plurality of cycles proceed, the protective region is expanded in a depth direction of the opening along the side wall surface defining the opening.

6. The method according to claim 5, wherein the substrate further includes a mask provided on the film.

7. The method according to claim 6, further comprising:
   reducing a thickness of the protective region by plasma etching between at least two cycles of the plurality of cycles.

8. The method according to claim 7, further comprising:
   forming the opening in the film before executing the plurality of cycles.

9. The method according to claim 7, wherein the plurality of cycles are executed in a decompressed space maintained continuously within a chamber of a single plasma processing apparatus without removing the substrate from the chamber.

10. The method according to claim 9, wherein the plasma processing apparatus is a capacitively coupled plasma processing apparatus including:
    the chamber;
    a support including a lower electrode, and configured to support the substrate in the chamber;
    a gas supply configured to supply the precursor gas and the processing gas into the chamber;
    an upper electrode provided above the support;
    a first radio-frequency power source configured to supply a first radio-frequency power for generating plasma, to the upper electrode; and
    a second radio-frequency power source configured to supply a second radio-frequency power for drawing ions into the substrate, to the lower electrode.

11. The method according to claim 10, wherein the film is a low-dielectric constant film containing silicon, carbon, oxygen, and hydrogen,
    the precursor contained in the precursor layer contains silicon,
    the chemical species that etches the film includes a fluorine chemical species and a nitrogen chemical species, and
    the precursor is nitrided by the nitrogen chemical species.

12. The method according to claim 10, wherein the film is a low-dielectric constant film containing silicon, carbon, oxygen, and hydrogen,
    the precursor contained in the precursor layer contains metal, the chemical species that etches the film includes a fluorine chemical species and a nitrogen chemical species, and the another chemical species includes an oxygen chemical species.

13. The method according to claim 10, wherein the film is a polycrystalline silicon film, the precursor contained in the precursor layer contains silicon or metal, the chemical species that etches the film includes a halogen chemical species, and the another chemical species includes an oxygen chemical species.

14. The method according to claim 10, wherein the film is a silicon nitride film, the precursor contained in the precursor layer contains silicon or metal, the chemical species that etches the film includes a chemical species formed from a hydrofluorocarbon in the processing gas; and the another chemical species includes an oxygen chemical species.

15. The method according to claim 10, wherein the film is an organic film, the chemical species that etches the film includes an oxygen chemical species, and a precursor contained in the precursor layer is oxidized by the oxygen chemical species.

16. The method according to claim 15, wherein the precursor contains silicon or metal.

17. The method according to claim 16, wherein the metal is tungsten or titanium.

18. A method for etching a film, comprising:

supplying a precursor gas to a substrate provided with the film and including a side wall surface and a bottom surface defining an opening, thereby forming a precursor layer on the substrate; and etching the film with a chemical species from plasma formed from a processing gas so as to increase a depth of the opening, and simultaneous with the etching, forming a protective region from the precursor layer by reacting the precursor layer with the chemical species or another chemical species from the plasma, wherein a plurality of cycles each including the supplying the precursor gas and the etching the film is executed, and a temperature of the substrate during execution of the etching the film included in at least one cycle of the plurality of cycles and a temperature of the substrate during execution of the etching the film included in at least one other cycle of the plurality of cycles are set to be different from each other.

19. The method according to claim 18, wherein:

the precursor layer includes silicon or a metal; and the forming of the protective region includes oxidizing or nitriding the precursor layer simultaneous with the etching the film by reacting the chemical species or the another chemical species of the plasma with the precursor layer.

* * * * *